United States Patent

[11] 3,590,345

[72] Inventors Joe E. Brewer
Severna Park;
Charles L. Laughinghouse, Linthicum Heights, both of, Md.
[21] Appl. No. 836,481
[22] Filed June 25, 1969
[45] Patented June 29, 1971
[73] Assignee Westinghouse Electric Corporation
Pittsburgh, Pa.

[54] DOUBLE WALL PN JUNCTION ISOLATION FOR MONOLITHIC INTEGRATED CIRCUIT COMPONENTS
2 Claims, 4 Drawing Figs.

[52] U.S. Cl. .......... 317, 317/235 E, 317/235 AE
[51] Int. Cl. .......... H01l 19/00
[50] Field of Search .......... 317/235

[56] References Cited
UNITED STATES PATENTS
3,502,951 4/1970 Hunt .......... 317/235

*Primary Examiner*—Jerry D. Craig
*Attorneys*—F. Shapoe and C. L. Menzemer

ABSTRACT: Described is a system for electrically isolating discrete components of a monolithic integrated circuit one from the other by a pair of spaced diffused walls of the same conductivity type as the substrate for the integrated circuit and surrounding a discrete circuit component such as a transistor, diode or resistor. The inner diffused wall is electrically shorted to the material into which it is diffused to greatly reduce the gain of substrate parasitic transistor configurations and to reduce lateral parasitic transistor currents.

PATENTED JUN 29 1971 3,590,345

WITNESSES

Edwin E. Bassler

James F. Young

INVENTORS

Joe E. Brewer and

Charles L. Laughinghouse

BY

ATTORNEY

DOUBLE WALL PN JUNCTION ISOLATION FOR MONOLITHIC INTEGRATED CIRCUIT COMPONENTS

BACKGROUND OF THE INVENTION

In the manufacture of monolithic integrated circuits, many different circuit components such as transistors, diodes and the like are formed on the same substrate. This gives rise to the necessity for electrically isolating the various components one from the other. In the case where the components are to be formed in N-type background material, this is accomplished by means of a P-type diffusion or wall electrically continuous with the substrate, and surrounding the component to form a blocking PN junction. The use of such approach to isolation, however, gives rise to lateral and vertical parasitic transistor effects, with the substrate and the P-wall acting as a collector of a parasitic transistor.

Parasitic transistor effects can be reduced by means of a gold diffusion which reduces carrier lifetimes. As a result, parasitic transistor gains are reduced; but the gold diffusion also affects other circuit variables such as diode recovery time, saturation voltage, and leakage current. For this reason, gold doping is undesirable in certain applications, particularly in linear and digital areas requiring high resistivity epitaxial material.

SUMMARY OF THE INVENTION

As an overall object, the present invention seeks to provide a system for the PN junction isolation of monolithic integrated circuit components, which system greatly reduces the gain of substrate parasitic transistors.

More specifically, an object of the invention is to provide a monolithic integrated circuit configuration using a diffused P-wall surrounding a circuit component as in prior art devices, but additionally including a second diffused wall which degenerates the major parasitic transistor to a back-biased PN junction diode which blocks parasitic currents.

This invention can be applied to isolate resistors, diodes, transistors, thyristors, and other circuit components. In many cases the performance of these components will be so critically related to the performance of this isolation system that separate realization is not feasible.

This invention is realized in a monolithic integrated circuit structure consisting of a substrate of semiconductive material of one type conductivity having formed on a surface thereof a layer of semiconductive material of the opposite type conductivity. A pair of continuous spaced walls of said one type conductivity are formed in said layer of material of the opposite type conductivity. The outermost of said walls is electrically continuous with the substrate. The innermost of said walls is separated from said substrate by a high concentration region of opposite type conductivity electrically continuous with said layer of material adjacent to the wall. The innermost wall of the pair of walls is electrically connected to the layer of opposite conductivity type. In this structure the outermost wall will form a lateral parasite transistor to the substrate with an emitter to base short circuit. This latter feature degenerates the outer wall from an active parasite transistor to a back-biased diode, thereby improving component isolation.

The above and other objects and features of the invention will become apparent from the following detailed description taken in connection with the accompanying drawings which form a part of this specification, and in which.

Figure 1:
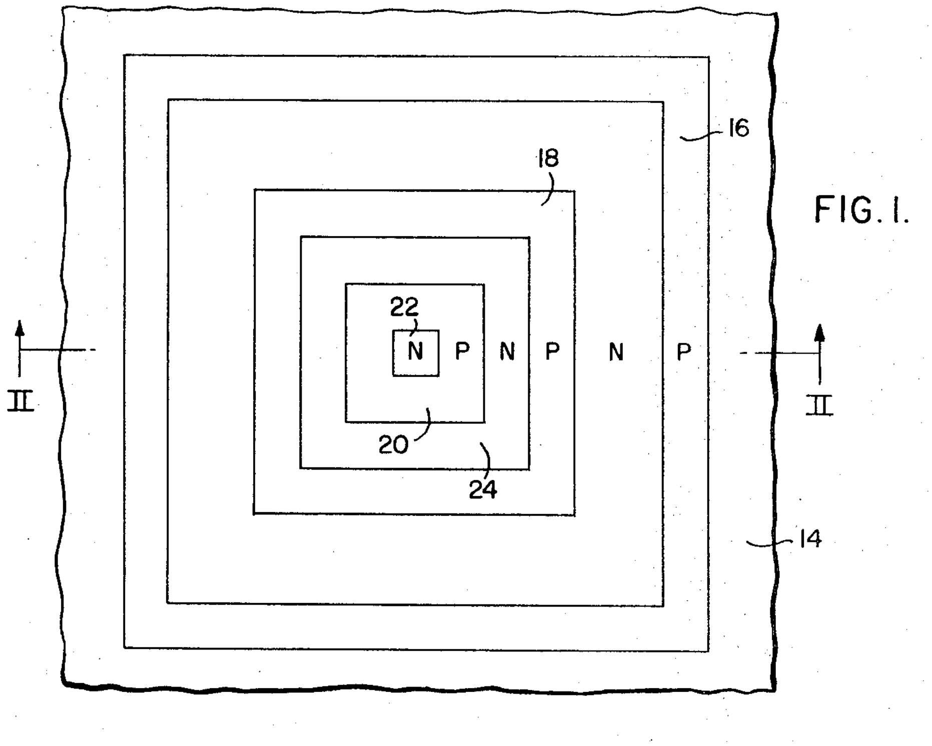
FIG. 1 is a top view of one embodiment of the invention.
Figure 2:
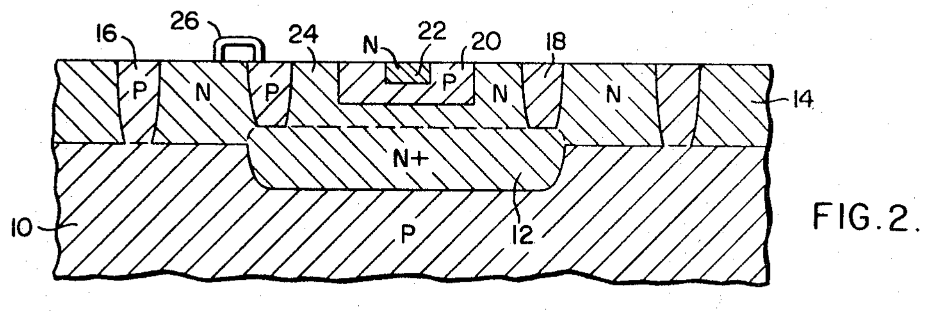
FIG. 2 is a cross-sectional view taken along line II—II of FIG. 1.

With reference now to FIGS. 1 and 2, a simplified view of a double-wall isolation moat is shown. Oxide layers, interconnect metallization, and N+ diffusions in N-type regions for ohmic contact with aluminum conductors are omitted for clarity. The fabrication sequence for the double-wall moat of FIGS. 1 and 2 are identical with that used for conventional single-wall isolation. The additional interfaces between regions of different conductivity do not impose any new restrictions on the voltage breakdown characteristics of circuit components.

In the manufacture of the integrated circuit component of FIGS. 1 and 2, a P-type silicon crystal 10 is used as the substrate material. Diffusion of an N-type dopant into the substrate establishes an N+ buried layer region 12 which, as will be seen, reduces vertical parasitic transistor effects with the substrate 10. The edge of region 12 is not shown in FIG. 1 because it is below the top surface. Deposited onto the upper surface of the substrate 10, by epitaxial techniques, is a layer of N-type silicon 14. Diffused into the layer of N-type material 14 are two surrounding P-type walls 16 and 18 which extend through the N-type layer 14 and contact the P-type substrate 10 and the N+ diffused region 12, respectively. The outermost wall 16 electrically isolates a portion 24 of the N-type layer 14. The inner wall 18 is electrically connected to the N-type epitaxial layer 24 by an aluminum metallization, schematically illustrated at 26. Finally, as an example of an isolated component a transistor structure comprising a P-type base 20 and an N-type emitter 22 diffused into the N-type layer 24 within the double-wall moat formed by the P-walls 16 and 18. With this configuration, the N-type material 24 and N+ material 12 forms the collector of an NPN transistor of which the P-type region 20 is the base and the N-type region 22 is the emitter.

Figure 3:
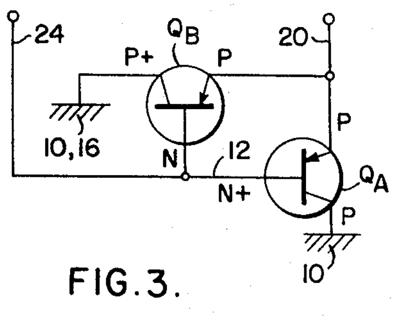
FIG. 3 is an equivalent circuit diagram of parasitic transistor effects which occur with a single isolation wall.

A single wall 16 will serve to electrically isolate one component from an adjacent component formed on the same substrate 10. Let us assume, for example, that a a second NPN transistor, not shown, is formed adjacent that shown in FIG. 2. If it were not for the wall 16 the collectors comprising the N-type epitaxial material 14 would be interconnected and shorted. However, with such a configuration, serious lateral parasitic transistor effects occur. This can be explained by reference to the equivalent circuit diagram of FIG. 3. The P-type base 20, the N-type collector 24 and the N+ buried layer 12, and the P-type substrate 10 form a PNP parasitic transistor $Q_A$. The gain of this parasitic transistor, however, is relatively low by virtue of the N+ buried region 12 of low resistivity. At the same time, a parasitic transistor $Q_B$ is formed by the P-type base 20, the N-type collector 24, and the P-type wall 16 connected to the P-type substrate 10. The gain of this PNP parasitic lateral transistor is relatively high.

Figure 4:
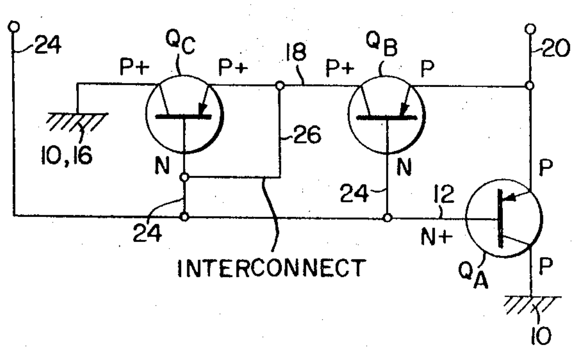
FIG. 4 is an equivalent circuit diagram of parasitic transistor effects with the double-wall isolation of the present invention.

The effect of providing a second P-wall 18 and of interconnecting that inner P-wall 18 to the N-type epitaxial layer 24 via aluminum metallization 26 is illustrated by the equivalent circuit diagram of FIG. 4 wherein elements corresponding to those shown in FIG. 1 are identified by like reference numerals. The connection 26 may be formed on either side of the P-wall 18. In this case, a third parasitic transistor $Q_C$ is formed by the P-wall 18, the N-type epitaxial layer 24 and the P-wall 16 and substrate 10. By virtue of the fact that the base and emitter of the parasitic transistor $Q_C$ are effectively shorted out by the interconnection 26, the parasitic transistor $Q_C$ is always turned off and stops the flow of lateral parasitic currents to the substrate 10 through the P-wall 16.

The transistors $Q_A$ and $Q_B$ as shown in FIG. 4 share a single P-type diffusion 20 as an emitter. The emitter resistivity is necessarily a function of the design requirements for the component to be formed in the moat defined by the walls 16 and 18. This means that the only degree of design freedom left for control of parasitic transistor gain is alteration of the N-type base region resistivity. The lower the base resistivity, the lower the gain will be. The gain of the vertical parasitic transistor $Q_A$ is degenerated considerably by the presence of the N+ buried layer 12. The lateral parasitic transistor of FIG. 3 $Q_B$, however, does not share the beneficial effects of the buried layer. Its gain is much higher than that of the vertical transistor $Q_A$. This situation becomes more acute as the component performance requirements force the use of higher epitaxial resistivities. The double-wall isolation moat of the invention, which provides an additional turned off PNP transistor in the path of the usual lateral transistor parasitic currents, eliminates the contribution of transistor $Q_B$ to parasitic transistor action.

Although the invention has been shown in connection with a certain specific embodiment, it will be readily apparent to those skilled in the art that various changes in form and arrangement of parts may be made to suit requirements without departing from the spirit and scope of the invention.

We claim as our invention:

1. In a monolithic integrated circuit structure, a substrate of semiconductive material of one type conductivity having formed on a surface thereof a layer of semiconductive material of the opposite type conductivity, a buried region of high impurity concentration material of the opposite type conductivity at the interface of said layer and said substrate, a pair of continuous spaced walls of said one type conductivity formed in said layer of material of the opposite type conductivity, the innermost wall of which terminates in said buried region and the outermost wall of which extends to and is electrically continuous with said substrate, whereby an isolation moat for an integrated circuit component is formed, a circuit component formed in said moat and including a region of one conductivity type forming a PN junction with said layer and means for electrically connecting said innermost wall to the portion of said layer of material of the opposite type conductivity between said pair of walls whereby the region of said component will not exhibit lateral parasitic transistor action to said substrate and said outermost wall.

2. The isolation moat structure of claim 1 wherein said substrate is of P-type material, said layer of semiconductive material is epitaxially deposited N-type material, said spaced walls are P-type diffused regions formed in said epitaxial layer, said buried region is of N+ type material and the region of said component is of P-type material.